United States Patent [19]

Grabbe

[11] Patent Number: 5,380,221

[45] Date of Patent: Jan. 10, 1995

[54] ANCHOR PIN

[75] Inventor: Dimitry G. Grabbe, Middletown, Pa.

[73] Assignee: The Whitaker Corporation, Wilmington, Del.

[21] Appl. No.: 80,016

[22] Filed: Jun. 18, 1993

[51] Int. Cl.⁶ .............................................. H01R 13/73
[52] U.S. Cl. .................... 439/573; 411/909; 411/DIG. 2
[58] Field of Search ............... 439/83, 573; 411/501, 411/909, DIG. 2; 29/522.1

[56] References Cited

U.S. PATENT DOCUMENTS

| | | | |
|---|---|---|---|
| 2,994,933 | 8/1961 | Wolfe | 24/141 |
| 4,676,565 | 6/1987 | Reichardt | 439/83 X |
| 4,802,860 | 2/1989 | Kikuta | 439/83 X |
| 4,822,671 | 4/1989 | Carper et al. | 411/501 X |
| 4,842,552 | 6/1989 | Frantz | 439/557 |
| 5,120,175 | 6/1992 | Arbegast et al. | 411/501 |

FOREIGN PATENT DOCUMENTS 0015958 2/1977 Japan .................................. 411/501

Primary Examiner—Eugene F. Desmond
Attorney, Agent, or Firm—Driscoll A. Nina; Bruce J. Wolstoncroft

[57] ABSTRACT

An anchor pin, for anchoring one component upon another, such as an electrical connector upon a printed circuit board, by way of a passage defined by a mounting hole in one of the components that is substantially aligned with an opening in the other component. The anchor pin having a first form with a volume larger than the volume defined by the passage while being receivable within the passage and a second form in response to an external energy input, whereby the anchor pin within the passage becomes fluid deforming to substantially fill the passage, automatically accommodating any misalignment, and overflowing therefrom to form opposing heads. The mounting pin hardens in this form to anchor the components together.

17 Claims, 2 Drawing Sheets

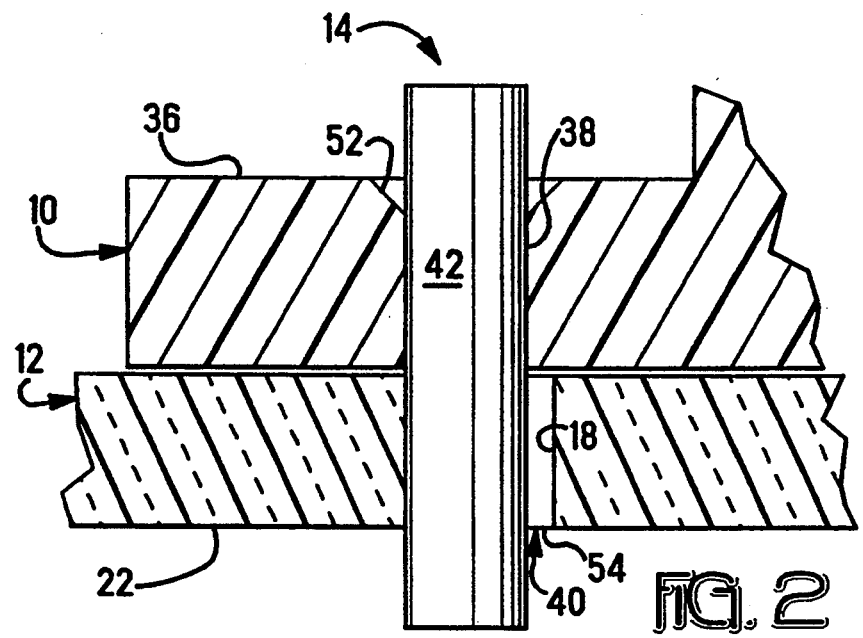
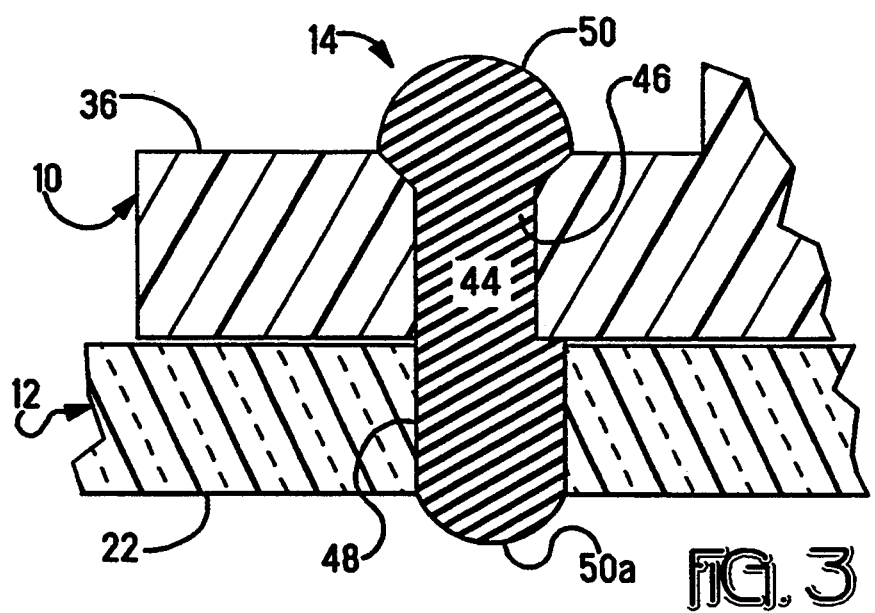

ANCHOR PIN

FIELD OF THE INVENTION

This invention relates to mechanical fasteners and has particular relevance to the mechanical fasteners used to attach an electrical connector to a substrate.

BACKGROUND OF THE INVENTION

The contacts of an electrical connector must be electrically connected to corresponding circuit pads on a substrate, for example a printed circuit board, in order to establish a circuit between the substrate and a mating device having a complementary connector. Typical contacts may have pads for surface mounting or pins for through-hole mounting to establish the electrical connection. Although these connections also have mechanical attributes, it is still necessary to mechanically anchor the connector to the substrate in order to prevent any force exerted on the connector during interconnection with a mating device from stressing the electrical interface and possibly damaging the electrical connection.

During assembly, an electrical connector will be placed on the substrate by an assembly mechanism, such as a robot. This placement may be passive or, if high placement accuracy is required, active, possibly utilizing a vision system that registers the images the contacts and the circuit pads. The housing of the electrical connector has a mounting hole that aligns with an opening in the substrate. A rivet, screw, pin, or other type of fastener mechanically anchors the connector housing to the substrate.

However, due to manufacturing inaccuracies, the mounting hole and the corresponding opening may have slightly different configurations or be misaligned when the contacts are properly aligned with the circuit pads. To accommodate these inaccuracies, the fastener is typically made smaller than the mounting hole and/or the corresponding opening by an amount that assures insertion at the largest acceptable deviation. Use of one undersized fastener allows for relative movement between the connector housing and the substrate, resulting in stress being transferred to the contact-circuit pad interface during connection with the mating device. These stresses may be sufficient to damage the electrical connection at the interface, thereby preventing the desired circuit from being established.

What is needed is an anchor pin that mechanically connects the connector housing to the substrate in a way that relative displacement between the two is prevented in spite of misalignment or other manufacturing inaccuracies, thereby protecting the electrical connection at the contact-circuit pad interface from stresses caused during connection with the mating device.

SUMMARY OF THE INVENTION

The present invention is an anchor pin for anchoring one component upon another, such as a connector upon a substrate, by way of a passage defined by a mounting hole in one of the components that is substantially aligned with an opening in the other component. The anchor pin has a first form that is receivable within the passage and has a volume larger than the volume defined by the passage. The anchor pin takes on a second form where, in response to an external energy input, the anchor pin within the passage becomes fluid deforming to substantially fill the passage, automatically accommodating any misalignment, and overflowing therefrom to form opposing heads. The mounting pin hardens in this form to anchor the connector to the substrate.

It is an object of this invention to provide an anchor pin for attaching mating components in a way that accommodates any misalignment between the features on the mating components used to effect such attachment, whereby relative displacement between the components is prevented.

It is a feature of this invention that the anchor pin has a first form that is receivable within a passage defined by the substantially aligned features on the mating components used to effect the attachment and a second form that, in response to an input of external energy, fills the volume of the passage and extends therefrom in the form of opposing heads, thereby automatically accommodating any misalignment of the features that define the passage and preventing relative displacement between the components.

It is an advantage of this invention that it may be used to anchor a connector to a substrate, preventing displacement therebetween. It is another advantage of this invention that when used to anchor an electrical connector having surface mount contacts the heat used to form the solder joint between the contact and the substrate also functions as the external energy input that causes the anchor pin to change from its first form to its second form. It is yet another advantage of this invention that when heat is used to effect the change in the anchor pin from its first form to its second form, the anchor pin melts and is subjected to surface tension forces that cause the anchor pin to fill the space and the volume of the passage automatically.

Other objects, features and advantages of the invention will become apparent upon inspection of the following figures and description.

BRIEF DESCRIPTION OF THE DRAWINGS

The invention will now be described by way of example with reference to the accompanying drawings in which:

FIG. 2 is a partial cut-away view of the first form of the anchor pin extending through the electrical connector and substrate.

FIG. 3 is a cut-away view of the second form of the anchor pin extending through the electrical connector and the substrate.

BRIEF DESCRIPTION OF THE PREFERRED EMBODIMENT

Figure 1:
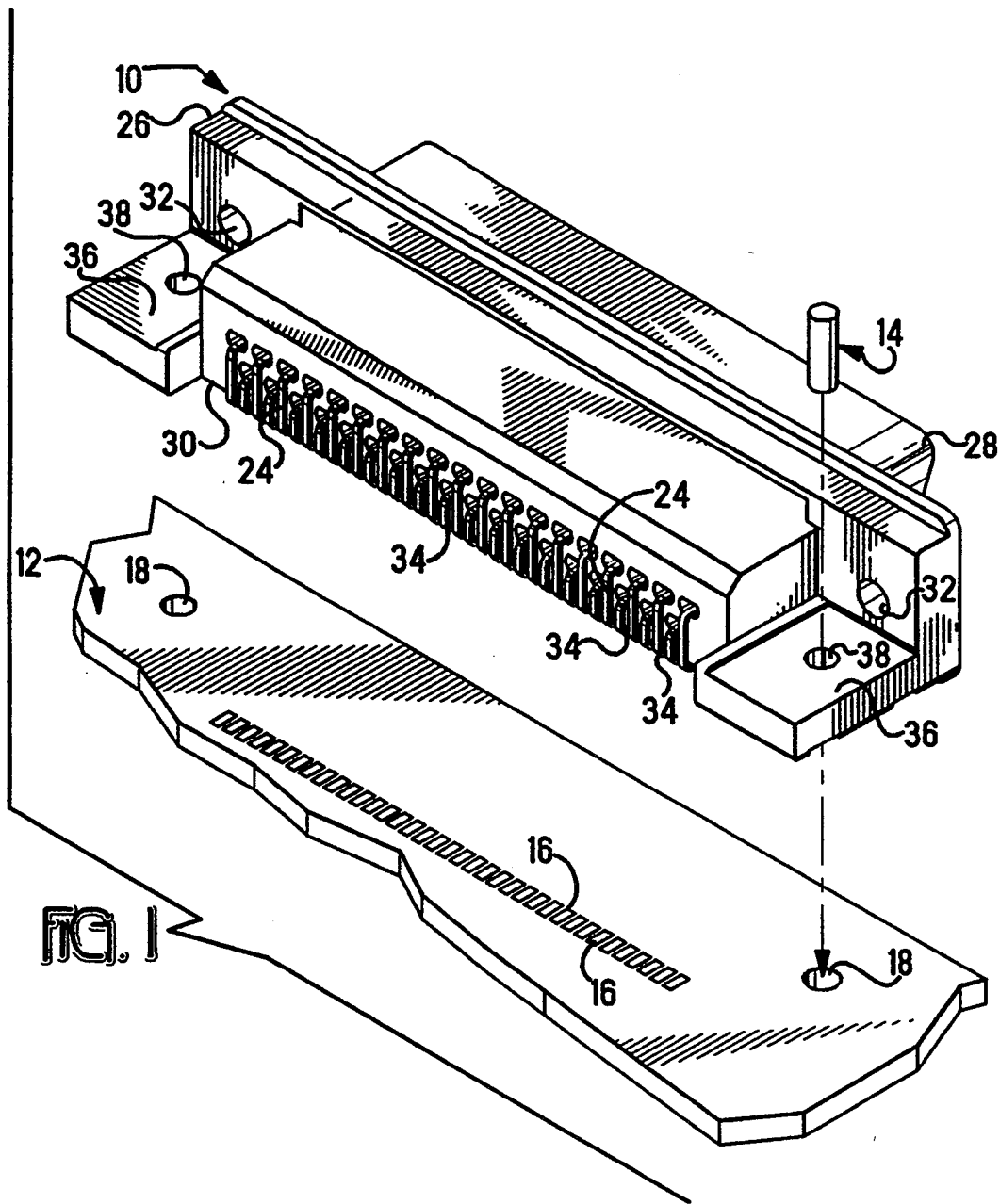
FIG. 1 is a partially cut-away and exploded perspective view of an electrical connector and substrate.

The present invention is applicable to the anchoring of various components to each other. FIG. 1 shows a representational electrical connector 10 that is to be mounted upon a substrate 12, for example a printed circuit board, through the use of an anchor pin 14. The substrate 12 has a plurality of circuit pads 16, with solder thereupon, for establishing electrical connection with components (not shown) on the substrate 12. An opening 18 is formed within the substrate 12 for receiving the anchor pin 14 that is used to mechanically attach the connector 10 to the substrate 12. The opening 18 passes between an inner surface 20 that faces the connector 10 and a bearing surface 22 facing away from the connector 10. The bearing surface 22 may be the back side of the substrate 12 or any other surface that generally faces away from the connector 10, such as the bottom of a counterbore or the inside of a countersink.

The connector 10 has contacts 24 within a connector housing 26. These contacts 24 are used to electrically connect the circuit pads 16 with a mating electrical device (not shown), such as a complementary connector incorporated into a cable, another substrate, or a bulkhead. The connector 10 has a mating device interface 28 constructed to receive the mating device. The interface 28 is shown in this representational electrical connector as being oriented at 90 degrees to a mounting surface 30 that faces the substrate 12. The interface 28 also includes captivating holes 32 for providing detachable mechanical connection with the mating device.

Each of the contacts 24 has a surface mountable foot 34 extending below the mounting surface 30 for electrical connection to the circuit pads 16 by soldering techniques, such as reflow soldering. These contacts 24 could also be adapted for plated-through-hole electrical connection or any other configuration that is used for this type of electrical connection. The contact 24 is also accessible within the mating device interface to connect with a complementary connector on the mating device to form the desired electrical circuit.

The connector housing 26 has an outer surface 36 that generally faces away from the mounting surface 30. While shown as planar, effective anchoring may occur regardless of the form of this surface. A mounting hole 38, used for mechanically attaching the connector 10 to the substrate 12, masses between the outer surface 36 and the mounting surface 30. The mounting hole 38 is generally similar in size, shape and location to the corresponding opening 18 in the substrate 12.

As shown in FIGS. 2 and 3, when the connector 10 and the substrate 12 are joined together, a passage 40 is defined between the outer surface 36 and the bearing surface 22 of the substrate 12 by the features used to attach the connector 10 to the substrate 12, the mounting hole 38 and the corresponding opening 18. These features 18,38 that make up the passage 40 are substantially aligned or, in other words, slightly misaligned. While the configurations of the mounting hole 38 and the corresponding opening 18 are shown as cylindrical, other shapes are envisioned as being useful. The cylindrical shape is easily manufactured, however the cylinders produced may not be perfectly round or perfectly coaxial.

The anchor pin 14 has a first form 42 and a second form 44. The first form 42 of the anchor pin 14 is receivable within the passage 40. One configuration of the first form 42 is shown in FIG. 2 as a substantially rigid form that basically corresponds to the mounting hole 38 and the corresponding opening 18. Other shapes may also be utilized, such as a gradually tapered conic section or a less rigid form. The volume of the anchor pin 14 is selected to exceed the volume of the space defined by the passage 40. As shown in FIG. 2, the first form 42 of the anchor pin 14 extends through the passage 40 and beyond both the outer surface 36 of the connector housing 26 and the bearing surface 22 of the substrate 12.

As shown in FIG. 2, in order to facilitate assembly, the anchor pin 14 may De received within the mounting hole 38 of the connector housing 26 in an interference fit. Here a tapered conic section may be an appropriate configuration for the first form 42 of the anchor pin 14. Other cross-sectional shapes that produce at least two points of contact along the passage 40 may also be used.

The corresponding opening 18 in the substrate 12 is made large enough to accommodate the manufacturing inaccuracies mentioned above, thereby enabling the anchor pin 14 to be inserted therein without interference. The connector housing 26 and the anchor pin 14, in its first form 42, may be pre-assembled prior to being positioned on the substrate 12 so that when the foot 34 of the contact 24 corresponds with the circuit pads 16 the anchor pin 14 will fit into the corresponding opening 18 without interference.

Once the contacts 24 are aligned with the circuit pads 16, the electrical connection is made permanent by such techniques as fellow soldering. During reflow soldering, the area o[the substrate 12 that the connector 10 is to be attached is subjected to an external input of energy in the form of heat sufficient to cause the solder on the circuit pads 16 to flow, thereby bonding with the contacts 24 of the connector 10. If the anchor pin 14 is made of a material with an appropriate melting point, the heat from the soldering operation will cause the first form 42 of the anchor pin 14 to melt. Rather than gravity causing the melting anchor pin 14 to drain from the passage 40, because the anchor pin 14 represents a small volume, the primary force that acts on the melting anchor pin 14 is surface tension.

If unconstrained, the surface tension deforms the melted first form 42 of the anchor pin 14 into a sphere; however, the melted anchor pin 14 is constrained by the passage 40. Because the anchor pin 14 was constructed with a volume greater than the volume of the passage 40, the surface tension of the melted first form 42 of the anchor pin 14 fills the passage 40. A first portion 46 fills the mounting hole 38 of the connector 10 and a second portion 48 fills the corresponding opening 18 in the substrate 12. The material that exceeds the volume of the passage 40 extends beyond their respective surfaces 22,36 in the form of opposing heads 50, 50a. This second form 44 of the anchor pin 14 is shown in FIG. 3.

The second form 44 of the anchor pin 14 fills the passage 40 and substantially assumes its shape, thereby preventing the substrate 12 and the connector 10 from moving relative to each other. Upon solidification, the anchor pin 14 hardens in its second form 44 to permanently anchor the connector housing 26 to the substrate 12. In order to enhance the effectiveness of the second form 44 of the anchor pin 14, a chamfer 52 may be formed where the passage 40 intersects the outer surface 36, or where the passage 40 intersects the bearing surface 22. This chamfer 52 may be made so large that the respective head 50 of the second form 44 of the anchor pin 14 does not extend beyond the respective surface 22,36. In this instance, the chamfer 50 effectively becomes the respective surface 22, 36.

In addition to the use of a chamfer 52 to enhance the effectiveness of the anchor pin 14, especially where a printed circuit board serves as the substrate 12, the edges 54 of the passage 40, where it extends through the bearing surface 22, will be rough. Printed circuit boards are usually made of some form of glass fiber reinforced material. These glass fibers are fractured during the manufacturing processes, such as drilling or punching, that are used to form the opening 18, thereby assuring a good bond between the anchor pin 14 and the substrate 12.

The anchor pin 14 may be made by extruding or casting a plastic, a metal or any other material into the desired first form 42 of the anchor pin 14. So that an additional assembly operation is not required, where fellow soldering is going to be used, it is advantageous to select a material that has a melting point within the temperature range that the anchor pin 14 will be exposed to during reflow soldering. A heat curable "B" Staged Epoxy, similar to that used in making printed circuit board material, would be desirable because it would be compatible with printed circuit board material. The "B" Staged Epoxy, in its liquid form, could be placed into molds having the desired shape and then partially cured to drive out at least some of the solvents in the epoxy to leave a relatively rigid form. The remainder of the solvents will be expulsed when the anchor pin 14 takes on its second form 44, leaving a rigid and strong anchor pin.

A thermosetting plastic may be useful because its internal structure would cross-link after heat treatment to become an essentially non-deformable solid. Certain metals that have an appropriate melting point, such as alloys of CERROCAST, a registered trademark of Cerro Metal Products Company of Bellefonte, Pa., may also be used. In addition, a heat curable wax may also be used, even though it does not permanently set like the above-mentioned examples, if the temperature of the environment where the anchor pin 14 is used in does not exceed the melting point of the wax. This would allow easy detachment of the connector from the substrate if required.

Although use with an electrical connector 10 having contacts 24 that are reflow soldered to the substrate 12 is an especially attractive application for this invention, because separate assembly procedures are not required, this invention should not be so limited. It would also be possible to use a distinct energy source to cause the shift from the first form to the second form, such as an infrared laser. In addition, this invention is applicable to other types of connectors, such as fiber optic, and other fastening applications as well, including attaching more than two articles together.

It should be recognized that the above-described embodiments and forms, constitute the presently preferred forms of the invention and that the invention may take numerous other forms, only some of which have been described above. Accordingly, the invention should be only limited by the scope of the following claims.

I claim:

1. An anchor pin for anchoring a connector positioned upon a substrate, the connector having a outer surface facing opposite the substrate with a mounting hole extending therefrom and through the connector, the substrate having a bearing surface facing opposite the outer surface and an opening extending therefrom and through the substrate which is approximately aligned with the mounting hole to define a passage between the outer surface and the bearing surface for receiving the anchor pin, the anchor pin comprising:
   a mounting pin having
   a first form receivable within the passage and extending beyond the outer surface and the bearing surface; and
   a second form where, in response to an external energy input, the mounting pin within the passage is melted to become a fluid which flows to substantially fill the passage while overflowing the outer surface and the bearing surface to form opposing heads, the mounting pin hardening in this form to anchor the connector to the substrate.

2. The anchor pin of claim 1, wherein the anchor pin is a plastic.

3. The anchor pin of claim 1, wherein the first form of the anchor pin has a circular cross-section.

4. The anchor pin of claim 1, wherein the first form of the anchor pin is received within the mounting hole in a interference fit.

5. The anchor pin of claim 1, wherein the passage and anchor pin are dimensioned such as the external energy input is applied the anchor pin undertakes the second form due to the surface tension forces of the material and being constrained within the passage.

6. The anchor pin of claim 5, wherein the anchor pin is made of material which will melt as the material is exposed to reflow soldering.

7. The anchor pin for anchoring one component upon another, the anchor pin being within a passage defined by a mounting hole in one of the components that is substantially aligned with an opening in the other component, the anchor pin comprising:
   a first form that is receivable within the passage and has a volume larger than the volume defined by the passage; and
   a second form where in response to an external energy input the first form of the anchor pin within the passage melts and becomes fluid deforming to substantially fill the passage, automatically accommodating any misalignment, and overflowing therefrom to form opposing heads and hardening in this form to anchor the components together.

8. The anchor pin of claim 7, wherein, the passage and the anchor pin are configured such that the anchor pin deforms into the second form due to surface tension.

9. An electrical connector mountable to a substrate having circuit pads and openings that extend into the substrate to a bearing surface for anchoring the electrical connector thereupon, comprising:
   a housing having an outer surface facing generally away from the substrate; and electrical contact within the housing connectable to one of the circuit pads; and a mounting hole extending through the connector from the outer surface in approximate alignment with one of the openings so that when the contact is aligned with one of the circuit pads the opening and the mounting hole define a substantially aligned passage between the outer surface and the bearing surface; and
   an anchor pin having
   a first form that is receivable within the passage and has a volume that exceeds a volume defined by the passage; and
   a second form where, in response to an external energy input, the anchor pin melts to become a fluid which is deformed to substantially fill the passage and overflow therefrom to form opposing heads, the anchor pin hardening in this form, thereby anchoring the housing to the substrate.

10. The electrical connector of claim 9, wherein the contact is soldered to the circuit trace and the heat of soldering is the external energy input that causes the anchor pin to deform.

11. The electrical connector of claim 9, wherein the first form of the mounting pin is received within the passage in an interference fit.

12. The electrical connector of claim 9, wherein the mounting hole is smaller than the opening.

13. The electrical connector of claim 9, wherein the contact has a foot that is solderable to the circuit pad.

14. The electrical connector of claim 13, wherein the foot is surface mount soldered to the circuit trace through reflow soldering.

15. An anchor pin for anchoring a connector positioned upon a substrate, the connector having a outer surface facing opposite the substrate with a mounting hole extending therefrom and through the connector, the substrate having a bearing surface facing opposite the outer surface and an opening extending therefrom and through the substrate which is approximately aligned with the mounting hole to define a passage between the outer surface and the bearing surface for receiving the anchor pin, the anchor pin comprising:

a mounting pin made from a B-State Epoxy, the mounting pin having a first form receivable within the passage and extending beyond the outer surface and the bearing surface; and a second form where, in response to an external energy input, the mounting pin within the passage becomes fluid and substantially fills the passage while overflowing the outer surface and the bearing surface to form opposing heads, the mounting pin hardening in this form to anchor the connector to the substrate.

16. An anchor pin for anchoring a connector positioned upon a substrate, the connector having a outer surface facing opposite the substrate with a mounting hole extending therefrom and through the connector, the substrate having a bearing surface facing opposite the outer surface and an opening extending therefrom and through the substrate which is approximately aligned with the mounting hole to define a passage between the outer surface and the bearing surface for receiving the anchor pin, the anchor pin comprising:

a mounting pin made from metal, the mounting pin having a first form receivable within the passage and extending beyond the outer surface and the bearing surface; and a second form where, in response to an external energy input, the mounting pin within the passage becomes fluid and substantially fills the passage while overflowing the outer surface and the bearing surface to form opposing heads, the mounting pin hardening in this form to anchor the connector to the substrate.

17. An anchor pin for anchoring a connector positioned upon a substrate, the connector having a outer surface facing opposite the substrate with a mounting hole extending therefrom and through the connector, the substrate having a bearing surface facing opposite the outer surface and an opening extending therefrom and through the substrate which is approximately aligned with the mounting hole to define a passage between the outer surface and the bearing surface for receiving the anchor pin, the anchor pin comprising:

a mounting pin made from wax, the mounting pin having a first form receivable within the passage and extending beyond the outer surface and the bearing surface; and a second form where, in response to an external energy input, the mounting pin within the passage becomes fluid and substantially fills the passage while overflowing the outer surface and the bearing surface to form opposing heads, the mounting pin hardening in this form to anchor the connector to the substrate.

* * * * *